(12) United States Patent
Sarangi et al.

(10) Patent No.: US 9,329,963 B2
(45) Date of Patent: May 3, 2016

(54) DEBUG APPARATUS AND METHODS FOR DYNAMICALLY SWITCHING POWER DOMAINS

(71) Applicant: Advanced Micro Devices, Inc., Sunnyvale, CA (US)

(72) Inventors: Shantanu K. Sarangi, San Jose, CA (US); Christian Warling, Loveland, CO (US); Eric Rentschler, Ft. Collins, CO (US); Vikram Chopra, Fremont, CA (US); Mihir Doctor, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 134 days.

(21) Appl. No.: 14/027,711

(22) Filed: Sep. 16, 2013

(65) Prior Publication Data

US 2015/0082092 A1   Mar. 19, 2015

(51) Int. Cl.
   *G06F 11/00* (2006.01)
   *G06F 11/27* (2006.01)
   *G01R 31/317* (2006.01)

(52) U.S. Cl.
   CPC .......... *G06F 11/27* (2013.01); *G01R 31/31705* (2013.01); *G01R 31/31721* (2013.01)

(58) Field of Classification Search
   CPC .................................................. G06F 11/3055
   See application file for complete search history.

(56) References Cited

U.S. PATENT DOCUMENTS

| | | | |
|---|---|---|---|
| 6,842,811 B2* | 1/2005 | Barry et al. | 710/260 |
| 8,024,591 B2* | 9/2011 | Bertelsen et al. | 713/323 |
| 8,402,314 B2* | 3/2013 | Balkan et al. | 714/31 |
| 8,656,220 B2* | 2/2014 | Lee et al. | 714/30 |
| 8,826,079 B2* | 9/2014 | Gilday et al. | 714/30 |
| 8,966,313 B2* | 2/2015 | Truong et al. | 714/30 |
| 2007/0106923 A1* | 5/2007 | Aitken et al. | 714/718 |
| 2012/0151263 A1* | 6/2012 | Rentschler et al. | 714/30 |
| 2012/0151264 A1* | 6/2012 | Balkan et al. | 714/34 |
| 2013/0080850 A1 | 3/2013 | Swoboda | |
| 2013/0159775 A1* | 6/2013 | Balkan et al. | 714/34 |
| 2014/0013421 A1* | 1/2014 | Hopkins et al. | 726/17 |
| 2014/0032801 A1* | 1/2014 | Nixon et al. | 710/107 |

* cited by examiner

*Primary Examiner* — Christopher McCarthy
(74) *Attorney, Agent, or Firm* — Volpe and Koenig, P.C.

(57) ABSTRACT

Methods and apparatus are provided that facilitate debugging operations for components that may include different power domains. In an embodiment, an integrated circuit (IC) includes a plurality of hardware sectors, each hardware sector associated with a debug observability circuit that is served by a debug data bus of a debug circuit. The plurality of hardware sectors includes a controlled sector residing in a dynamically-controlled power domain that may be turned off while the power domain of another sector remains on. A selectively switchable data bus component is configured to couple the debug observability circuit associated with the controlled sector to the debug data bus when the power to the controlled sector is on and to switch to bypass the debug observability circuit associated with the controlled sector when the power to the controlled sector is not on.

18 Claims, 6 Drawing Sheets

DEBUG APPARATUS AND METHODS FOR DYNAMICALLY SWITCHING POWER DOMAINS

FIELD OF INVENTION

Embodiments of the subject matter described herein relate generally to electronic circuits, and more particularly, relate to electronic circuits and debug operations performed thereon.

BACKGROUND

In development process of an integrated circuit (IC), it is desirable to ensure that the hardware works correctly in the expected operating space before the IC is shipped in volume. Generally, the use of debug circuits and processes are well known in art to assist in the testing of ICs. U.S. Patent Publication No. 2012/0151263 A1 describes various embodiments of debug circuits and processes.

One challenge is to do a thorough job so that ICs are not deployed in the field, and then significant problems are subsequently discovered (e.g., by an original equipment manufacturer (OEM)). However, this is not always possible. One reason is that insufficient time may be available for cycling the hardware through every possible state and situation. Another reason is that certain aspects of the hardware and state machine functionality are opaque (i.e., not observable).

For power saving and other purposes, some hardware circuits may be designed to be selectively powered down and/or powered off. Such circuits present additional issues in the testing of ICs.

SUMMARY OF EMBODIMENTS

Methods and apparatus are provided that facilitate debugging operations for components that may include different power domains. In one embodiment, an integrated circuit (IC) includes a plurality of hardware sectors, each hardware sector associated with a debug observability circuit that is served by a debug data bus of a debug circuit. The plurality of hardware sectors includes a controlled sector residing in a dynamically-controlled power domain that may be turned off while the power domain of another sector remains on. A selectively switchable data bus component is configured to couple the debug observability circuit associated with the controlled sector to the debug data bus when the power to the controlled sector is on and to switch to bypass the debug observability circuit associated with the controlled sector when the power to the controlled sector is not on.

In another embodiment, a debug method for integrated circuit (IC) is disclosed. In an example method, the method operates with respect to a plurality of hardware sectors. Each hardware sector is associated with a debug observability circuit that is served by a debug data bus of a debug circuit. The plurality of hardware sectors includes a controlled sector residing in a dynamically-controlled power domain that may be turned off while the power domain of another sector remains on. The example method proceeds by selectively switching the debug observability circuit associated with the controlled sector to be coupled to the debug data bus when the power to the controlled sector is on and to be bypassed by the debug data bus when the power to the controlled sector is not on.

In a further embodiment a non-transitory computer-readable storage medium storing a set of instructions for execution by a general purpose computer to facilitate manufacture of an integrated circuit is provided. The instructions facilitate manufacture of an IC that includes a plurality of hardware sectors where each hardware sector is associated with a debug observability circuit that is served by a debug data bus of a debug circuit. The plurality of hardware sectors includes a controlled sector residing in a dynamically-controlled power domain that may be turned off while the power domain of another sector remains on. A selectively switchable data bus component is configured to couple the debug observability circuit associated with the controlled sector to the debug data bus when the power to the controlled sector is on and to switch to bypass the debug observability circuit associated with the controlled sector when the power to the controlled sector is not on.

The non-transitory computer-readable storage medium may include instructions that are hardware description language (HDL) instructions used for the manufacture of a device.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION OF THE PREFERRED EMBODIMENTS

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Technologies and concepts discussed herein relate to debug techniques implemented using debug circuits which may be integrated with multiple electronic modules of an integrated circuit. Debug state machines (DSMs) are exemplary debug circuits that may be employed in a variety of contexts. For example, a distinct DSM may be integrated with each of multiple cores of a multiple-core central processing unit (CPU), as well as being integrated with other electronic modules of the CPU (e.g., a Northbridge, a Southbridge, a Graphics Processing Unit (GPU), a special purpose processor, other types of processors, and so on), in an embodiment. Embodiments also include apparatus and methods that facilitate inter-communications between distinct DSMs within a single integrated circuit, between DSMs of multiple integrated circuits of a multi-chip module (MCM), and between DSMs of multiple packaged devices (e.g., DSM inter-communications from socket-to-socket). This inter-communication is referred to herein as "cross triggering."

DSMs may provide significant visibility to what is occurring in the electronic modules with which they are integrated. By providing methods and apparatus by which DSMs may communicate with each other, state-related aspects of a system that involve simultaneous participation of multiple electronic modules (e.g., multiple cores, a Northbridge, a Southbridge, a GPU, and so on) may be more accurately debugged. In various embodiments, the inter-communications made possible with the cross triggers enables the activities of the various DSMs to be tracked and coordinated across an entire system. Accordingly, the context of DSM activities across the entire system may be comprehended.

Before discussing the details of the various embodiments in detail, certain terminology is defined below to enhance understanding of the various embodiments. As used herein, a "DSM" refers to a discrete instantiation of debug circuitry (e.g., a state machine) that is integrated with an electronic module of a computing system, and which is configured to detect one or more "triggering events" and to perform one or more responsive "actions," where both the triggering events and the actions are events that occur in the context of debug operations for the computing system.

A DSM is configured to provide visibility (e.g., to external test equipment, such as a Hardware Debug Tool (HDT)) to the electronic module's functionality. The term "integrated with," as used herein to describe the coupling between a DSM and an electronic module, means that the DSM is electrically and/or communicatively coupled with portions of the electronic module that enable the DSM to detect signals produced by the electronic module (and/or other portions of the computing system within which the electronic module is integrated).

For example, but not by way of limitation, a DSM that is "integrated with" an electronic module may have access to one or more registers and/or other data storage locations within the electronic module, which enable the DSM to receive trace data that is produced and/or received by the electronic module while the electronic module is performing various operations (e.g., while the electronic module is executing software associated with a trace or test case). In an embodiment, observability of the trace data is provided to a DSM by way of a "debug bus," which provides an interface between portions of the electronic module and the DSM with which it is integrated. A DSM that is "integrated with" an electronic module is included on the same die as the electronic module, in an embodiment. The DSM may be included within the physical footprint of the electronic module or outside the physical footprint of the electronic module, in various embodiments.

As used herein, the term "triggering event" means an event detected by a DSM, which causes the DSM to take a particular action (e.g., based on a trigger-to-action mapping adhered to by the DSM). An "event" may be the receipt of a signal (or a combination of signals), the detection of a value (e.g., a register, clock or counter value) or another event that is detectable by the DSM, for example. Triggering events may be "internal" or "external." An "internal triggering event" means an event that is generated within the DSM itself, and which provides an impetus for the DSM to perform a responsive action. An "external triggering event" means an event that is generated or provided by a source external to the DSM (e.g., a debug bus, another DSM, and so on), and which also provides an impetus for the DSM to perform a responsive action.

One type of external triggering event is a "cross trigger," which is a signal that is conveyed over one or more dedicated communication lines between DSMs (referred to herein as a "cross trigger bus"). "Cross triggering" is a term that is used to refer to communication methods and apparatus by which multiple DSMs of a computing system may communicate in order to coordinate their operations. U.S. Patent Publication 2012/0151263 A1, which is incorporated herein by reference as if fully set forth, describes various modes of cross triggering.

Similar to triggering events, actions also may be "internal" or "external." An "internal" action is initiated by a particular DSM in response to a triggering event, where the internal action has a direct effect within the DSM itself. For example, but not by way of limitation, an internal action may include the DSM performing a state transition, generating a signal that is consumed within the DSM itself, and updating a value in an internal register. In contrast, an "external" action means a signal that is generated by a DSM in response to an internal or external triggering event, where the external action is observable by other DSMs and/or other components of the computing system. For example, but not by way of limitation, an external action may include the DSM generating a cross trigger on the cross trigger bus. In addition to providing cross triggers for analysis by other DSMs, a DSM may perform the action of triggering external analysis equipment (e.g., an HDT). DSMs also, optionally, may externally "irritate" as triggering events are detected, where the term "irritate" may be defined as a DSM initiating or preventing events in logic external to the DSM.

The computing system may be implemented on a single die, in an MCM, and/or as a plurality of discretely packaged devices (e.g., socketed devices disposed on one or more printed circuit boards (PCBs)). In an embodiment, DSMs that are integrated with multiple electronic modules of a single die communicate with each other over the cross trigger bus, which also is an integral part of the die. In other embodiments, discussed in more detail below, DSMs of different die of an MCM may communicate cross triggers between each other, and/or DSMs in devices installed in different sockets of a PCB (or multiple PCBs) may communicate cross triggers between each other.

Figure 1:
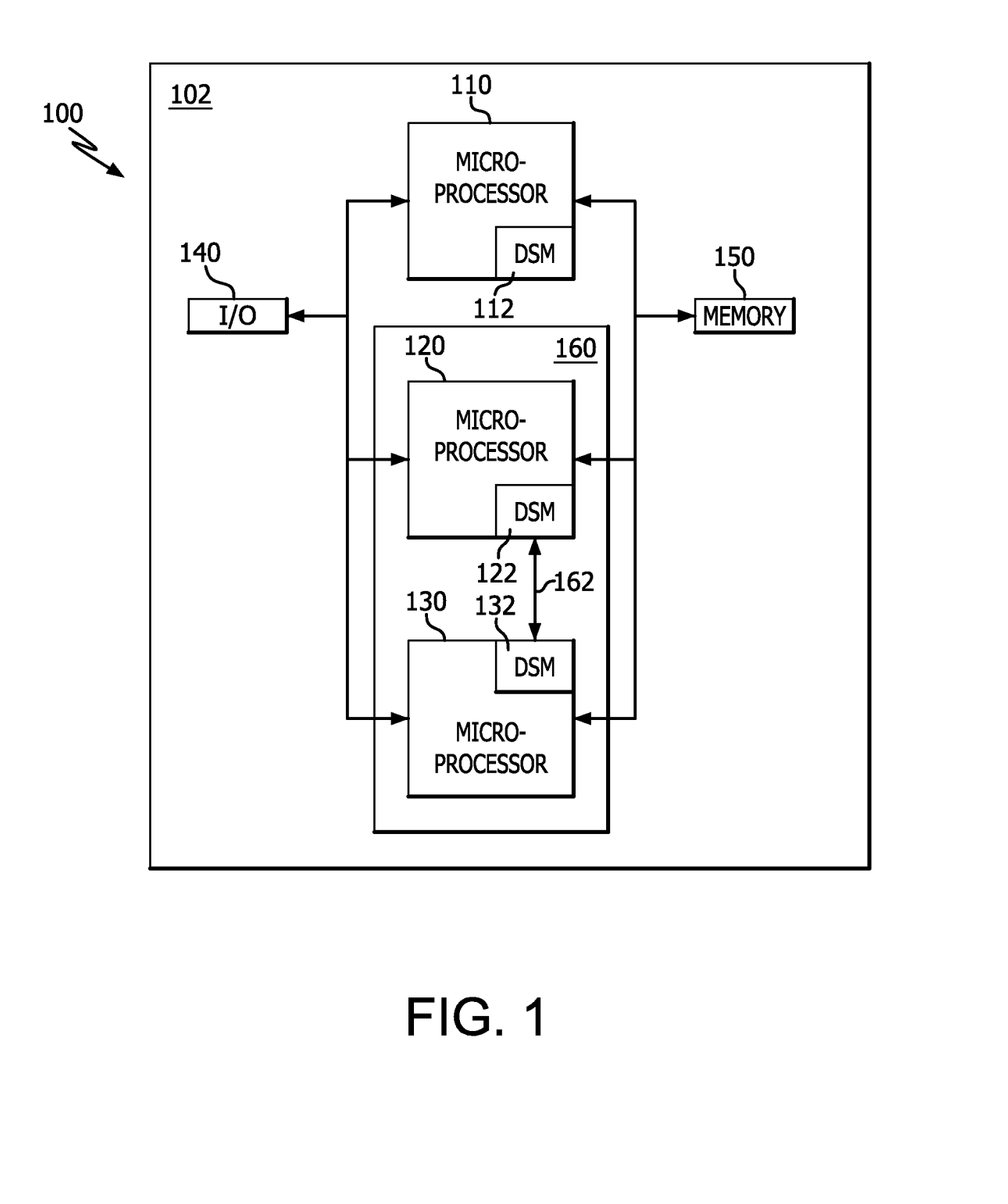
FIG. 1 is a block diagram of a computing system, in accordance with an embodiment.

FIG. 1 is a simplified block diagram of a computing system 100, in accordance with an example embodiment. It should be understood that FIG. 1 is a simplified representation of a computing system 100 for purposes of explanation and ease of description, and FIG. 1 is not intended to limit the subject matter in any way. Practical embodiments of the computing system 100 may include other devices and components for providing additional functions and features, and/or the computing system 100 may be part of a larger system, as will be understood. In other words, although a particular configuration of computing, memory, and other electrical components is depicted in FIG. 1, it is to be understood that the example configuration is intended to provide a framework for discussing embodiments of the inventive subject matter. Accordingly, the example configuration is not intended to depict all components of a functional computing system, and the embodiments are not intended to be limited to implementation within a computing system having the configuration of FIG. 1.

Computing system 100 is contained on a motherboard 102 (a printed circuit board), which includes one or more sockets, busses, slots, connectors, and conductors (not illustrated) with which various computing, memory, and other electrical components of the system are physically, electrically, and/or communicatively coupled. More particularly, computing system 100 includes at least one microprocessor 110, 120, 130, one or more input/output (I/O) peripherals 140, and memory 150. Although computing system 100 may include a number of other system components (e.g., clocks, power supplies, other processing components, discrete electronics, and so on), such components are excluded from FIG. 1 and are not discussed herein for the purposes of clarity and simplicity.

The I/O peripherals 140 generally represent the hardware, software, and/or firmware components configured to support communications to/from the microprocessors 110, 120, 130 and one or more peripheral (or external) devices. For example, the I/O peripherals 140 may be realized as busses or other communications interfaces configured to support data transmission to/from the microprocessors 110, 120, 130 in accordance with one or more data communication protocols. Memory 150 generally represents the main memory or primary memory for the computing system 100. Depending on the embodiment, memory 150 may be realized as a hard disk, flash memory, ROM memory, RAM memory, another suitable storage medium known in the art or any suitable combination thereof. Memory 150 maintains data and/or program instructions to support operations of the computing system 100 and/or microprocessors 110, 120, 130 as will be appreciated in the art. In an exemplary embodiment, memory 150 that is implemented separately from microprocessors 110, 120, 130 (e.g., on another chip and/or die) may be understood as being external to microprocessors 110, 120, 130.

Microprocessor 110 represents a discrete processing component that is implemented on a single die that is separately packaged from other system components, whereas microprocessors 120, 130 represent processing components that form portions of an MCM 160 (i.e., an electronic package that includes multiple die and/or other discrete components). Each of microprocessors 110, 120, 130 may include one or more DSMs 112, 122, 132, which may communicate and coordinate operations through the implementation of cross triggering. In order to implement die-to-die cross triggering, cross triggers may be communicated between the DSMs 122, 132 via a Die-to-Die Communication Link (DDCL 162) or other communications interface between DSMs 122, 132. In addition or alternatively, cross triggering may be implemented between DSMs on die within different packages (referred to herein as "socket-to-socket cross triggering"), in another embodiment. For example, cross triggering may be implemented between DSMs 112, 122 of microprocessors 110 and 120, which are housed in different packages.

Figure 2:
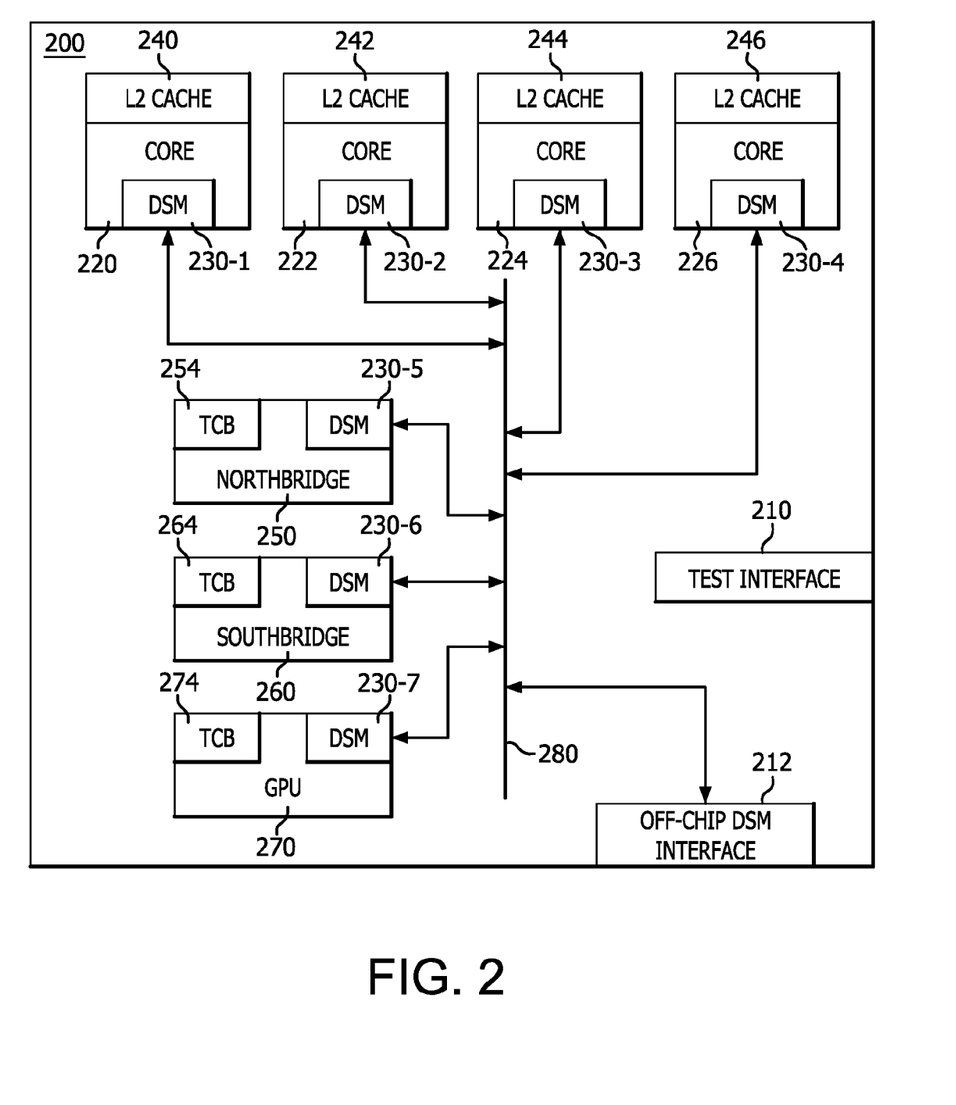
FIG. 2 is a block diagram of a system on a chip, in accordance with an embodiment.

Any one or more of microprocessors 110, 120, 130 may comprise a SOC, which includes a plurality of electronic modules, each of which includes at least one DSM. FIG. 2 is a block diagram of a SOC 200, in accordance with an example embodiment. It should be understood that FIG. 2 is a simplified representation of a SOC 200 for purposes of explanation and ease of description, and FIG. 2 is not intended to limit the subject matter in any way. Practical embodiments of the SOC 200 may include other devices and components for providing additional functions and features, as will be understood.

In an exemplary embodiment, SOC 200 includes a plurality of processing cores 220, 222, 224, 226 (each with an integrated DSM 230-1, 230-2, 230-3, 230-4), a plurality of trace data storage elements 240, 242, 244, 246, 254, 264, 274 (e.g., L2 caches and Trace Capture Buffers (TCBs)), a Northbridge 250 (or memory controller) (with an integrated DSM 230-5), a Southbridge 260 (with an integrated DSM 230-6), a GPU 270 (with an integrated DSM 230-7), and a cross trigger bus 280. Cross triggering to DSMs (not illustrated) on other die within the same package (e.g., in an MCM) and/or other packages may be achieved via off-chip DSM interface 212. Although FIG. 2 depicts each of processing cores 220, 222, 224, 226, Northbridge 250, Southbridge 260, and GPU 270 as including an associated DSM 230-1, 230-2, 230-3, 230-4, 230-5, 230-6, 230-7 (collectively "230"), some of these electronic modules may not include a DSM. In such cases, the electronic module may, instead, simply port signals in and out, as they relate to debug operations, or some of these electronic modules may not support debug operations at all.

Although SOC 200 is illustrated as including four cores 220, 222, 224, 226, a SOC may include more or fewer cores, in other embodiments (including as few as one single core). In addition, although SOC 200 is illustrated as including a single Northbridge 250, Southbridge 260, and GPU 270, some or all of these electronic modules may be excluded from SOC 200 (e.g., they may be located off-chip), in other embodiments. Furthermore, although SOC 200 is illustrated as including only one Northbridge 250, a SOC may include more than one Northbridge, in other embodiments. Besides the processing components and busses illustrated in FIG. 2, a SOC may include additional or different processing components, busses, and other electronic devices and circuitry, in various embodiments.

Processing cores 220, 222, 224, 226 generally represent the main processing hardware, logic and/or circuitry for the SOC 200, and each processing core 220, 222, 224, 226 may be realized using one or more arithmetic logic units (ALUs), one or more floating point units (FPUs), one or more memory elements (e.g., one or more caches), discrete gate or transistor logic, discrete hardware components, or any combination thereof. Although not illustrated in FIG. 2, each processing core 220, 222, 224, 226 may implement its own associated cache memory element (e.g., a level one or L1 cache) in proximity to its respective processing circuitry for reduced latency.

Northbridge 250, which also may be referred to as a "memory controller," in some systems, is configured to interface with I/O peripherals (e.g., I/O peripherals 140, FIG. 1) and memory (e.g., memory 150, FIG. 1). Northbridge 250 controls communications between the components of SOC 200 and the I/O peripherals and/or external memory. Southbridge 260, which also may be referred to as an "I/O controller hub," in some systems, is configured to connect and control peripheral devices (e.g., relatively low speed peripheral devices). GPU 270 is a special purpose microprocessor, which offloads and accelerates graphics rendering from cores 220, 222, 224, 226.

In the illustrated embodiment, caches 240, 242, 244, 246 and TCBs 254, 264, 274 provide intermediary memory elements having reduced size relative to external memory for temporarily storing data and/or instructions retrieved from external memory or elsewhere, and/or data produced by processing cores 220, 222, 224, 226, Northbridge 250, Southbridge 260, and GPU 270. For example, in an embodiment, caches 240, 242, 244, 246 and TCBs 254, 264, 274 provide memory elements for storing debug information (or "trace data") collected and/or produced by DSMs 230 during debug operations associated with the respective electronic modules with which they are integrated. In the illustrated embodiment, caches 240, 242, 244, 246 are in close proximity to and coupled between a respective processing core 220, 222, 224, 226 and the Northbridge 250. In this regard, caches 240, 242, 244, 246 may alternatively be referred to as core-coupled caches, and each core-coupled cache 240, 242, 244, 246 maintains data and/or program instructions previously fetched from external memory that were either previously used by and/or are likely to be used by its associated processing core 220, 222, 224, 226. Caches 240, 242, 244, 246 are preferably larger than L1 caches implemented by the processing cores 220, 222, 224, 226 and function as level two caches (or L2 caches) in the memory hierarchy. SOC 200 also may include another higher level cache (e.g., a level three or L3 cache, not illustrated) that is preferably larger than the L2 caches 240, 242, 244, 246.

In an exemplary embodiment, the SOC 200 includes a test interface 210 that comprises a plurality of pins dedicated for use in testing and/or configuring the functionality of the SOC 200. In one embodiment, the test interface 210 is compliant with the IEEE 1149.1 Standard Test Access Port and Boundary-Scan Architecture, that is, the Joint Test Action Group (JTAG) standards. Although the interconnections are not specifically illustrated in FIG. 2, the DSMs 230 are coupled to the test interface 210 and receive signals and/or bits from the test interface 210 that establish (or "program") a configuration for each DSM 230. In response, each DSM 230 operates according to the programmed configuration.

Each DSM 230 may be configured (e.g., programmed) differently from the other DSMs 230 in SOC 200 and/or in other parts of a computing system. More particularly, a DSM 230 may be programmed by establishing values in various DSM registers, which essentially pre-select which triggering events a DSM 230 may take action in response to detecting, and also pre-select the corresponding actions. In addition, certain triggering events and actions may not be programmable (e.g., pre-selectable), and a DSM 230 may take a particular action in response to a particular triggering event regardless of any DSM programming that may have been performed. As used herein, the term "widget" refers to a software routine that is configured, when executed, to program a DSM in a particular way (e.g., to establish particular DSM register values, resulting in the pre-selection of triggers, state transitions, and actions). In other words, a "widget" may be considered a setup program for a DSM. A "widget" also may be defined as a machine-readable program that enables a DSM to perform a set of state transitions in response to detecting that pre-selected triggers were produced. Diagnostic software may be configured to coordinate the execution of a sequence of widgets in order to configure DSMs 230 in various manners that provide a desired system visibility. The diagnostic software may be executed on the computing system (e.g., computing system 100) in which the DSMs 230 are incorporated, or on external test equipment.

According to an embodiment, a DSM 230 of an embodiment may support one or more functions selected from a group consisting of: 1) trace start/stop; 2) trace filtering; 3) cross triggering between DSMs; 4) clock stopping; 5) triggering external analysis equipment (e.g., providing HDT interrupts); and 6) providing a flexible microcode interface.

Cross triggering may be implemented via a cross trigger bus 280. Cross trigger bus 280 may include one or more, bi-directional conductors, which provide for signaling communication between DSMs 230. According to a particular embodiment, cross trigger bus 280 includes four parallel conductors, although cross trigger bus 280 may include more or fewer conductors, in other embodiments. Cross trigger bus 280 may be considered to be a "communications interface" between DSMs 230.

In response to detecting the occurrence of a triggering event for which a DSM 230 automatically should respond or that the DSM 230 has been programmed to respond to (e.g., a "pre-select triggering event"), the DSM 230 performs a corresponding action, as mentioned previously. According to an embodiment, a trigger-to-action map may be programmed into the DSM 230, which instructs the DSM 230 as to which particular action to perform when it detects a particular triggering event. The types of triggering events to which a DSM 230 will respond, and the responsive actions that the DSM 230 will implement depend, at least in part, on the DSM's programming, as mentioned above. In addition, certain types of internal and external triggering events and certain types of internal and external actions may be commonly attributed to DSMs 230 that are integrated with particular types of electronic modules (e.g., DSMs 230-1 through 230-4 that are integrated with cores 220, 222, 224, 226 may take different actions in response to different triggering events from the actions taken in response to triggering events detected by a DSM 230-5 that is integrated with Northbridge 250). For example, but not by way of limitation, a DSM 230 may be programmed to take one or more actions in response to one or more triggering events as follows.

Internal triggering events: A DSM may internally generate and respond to one or more internal triggering events selected from a group consisting of, but not limited to: a counter matching a first value; a clock count matching a second value; trace data matching a third value; trace data exceeding a fourth value; debug data matching a fifth value; a debug bus bit having a pre-defined state; a debug bus bit transition occurring; a random event occurring (e.g., as determined based on seed, polynomial, match, and mask registers); and a flag being asserted.

External triggering events: A DSM may detect and respond to one or more external triggering events selected from a group consisting of, but not limited to: receiving one or more signals from one or more sources external to the first electronic module, wherein the one or more signals are selected from a group consisting of a cross trigger signal on the communications interface; a trap signal; a clock stop signal; an error signal; a performance monitor ("perfmon") signal or event; an interrupt; a breakpoint; a microcode-based trigger (e.g., breakpoints, performance monitors, interrupts, and error events); and a timer overflow.

Internal Actions: In response to a triggering event, a DSM may take one or more internal actions selected from a group consisting of, but not limited to: performing a state transition; clearing a clock counter; stopping a counter; incrementing a general purpose counter; toggling a state bit of a general purpose counter; clearing a general purpose counter; setting or clearing a flag; toggling a random number; and enabling a pseudo-random event generator that can be used as a triggering event source for the DSM.

External Actions (e.g., "irritator actions"): In response to a triggering event, a DSM may take one or more external actions selected from a group consisting of, but not limited to: generating a cross trigger signal on the communications interface (e.g., asserting a cross trigger on the cross trigger bus 280, a die-to-die cross trigger, or a socket-to-socket cross trigger); generating a core stop clock signal; generating a die-wide stop clock signal; generating a self-refresh signal for a memory (e.g., memory 150, FIG. 1); generating a communication interface receive disable signal; generating a trace store signal; generating a machine check exception (MCE) signal; generating a debug event signal; triggering a debug microcode interrupt; setting and clearing various bits in a DSM microcode register to be read by microcode upon a debug microcode interrupt; starting storage of debug data to a state capture buffer (e.g., to a TCB and/or L2 cache); stopping storage of debug data to a state capture buffer; storing a clock count to a state capture buffer; and changing the size of a queue.

Figure 3:
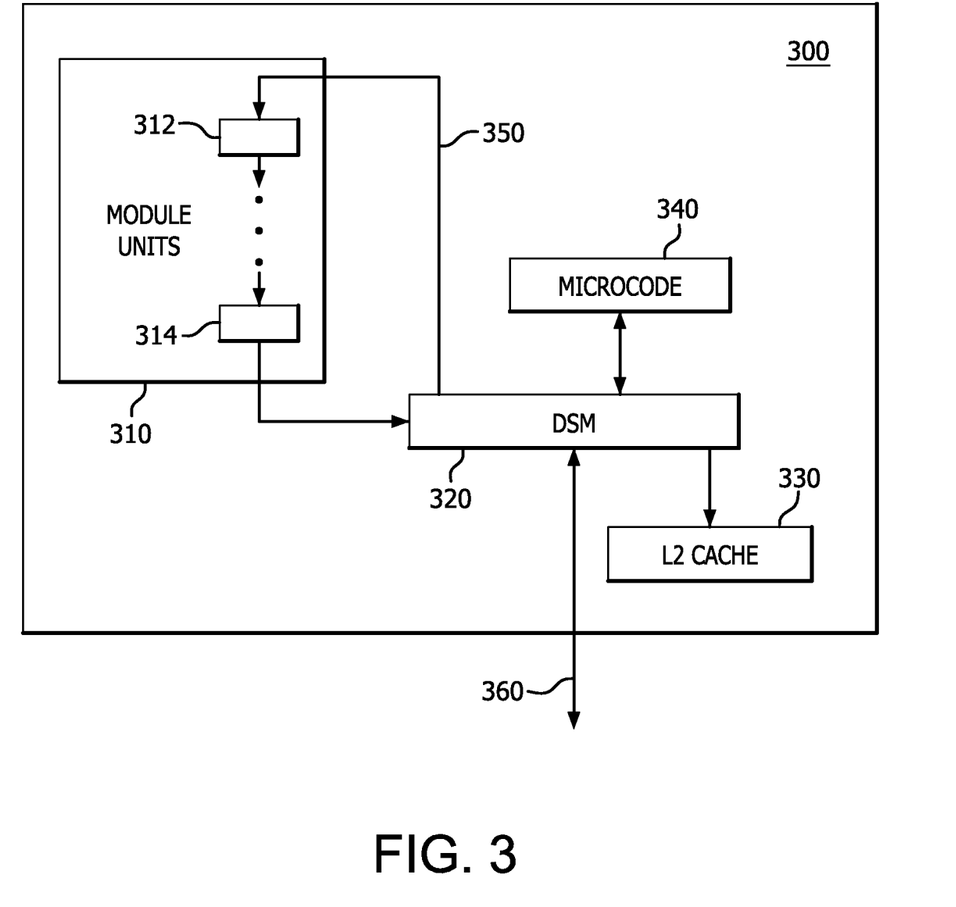
FIG. 3 is a block diagram of an electronic module with an integrated debug state machine, in accordance with an embodiment.

FIG. 3 is a block diagram of an electronic module 300 with an integrated DSM 320, in accordance with an embodiment. For example, electronic module 300 may be a processing core (e.g., one of cores 220, 222, 224, 226, FIG. 2), although electronic module 300 may be a different type of electronic module, as well. In an embodiment in which electronic module 300 is a processing core, DSM 320 may interface with microcode 340. This interface enables DSM 320 to observe the microcode being executed by the electronic module 300 and/or to modify execution of the microcode by the electronic module 300. In addition, as mentioned previously, DSM 320 may be capable of storing trace data in trace data storage (e.g., L2 cache 330), which includes information collected and/or produced by DSM 320 during execution of various operations performed by the electronic module 300.

Electronic module 300 also includes one or more "module units" 310, each of which may be configured to perform a set of actions or computations associated with the functionality of electronic module 300. DSM 320 is integrated with the various module units 310 by way of debug bus 350. Essentially, debug bus 350 functions as a conduit through which signals produced at various observability points 312, 314 within the module unit 310 may be conveyed to DSM 320. Although only two observability points 312, 314 are shown in FIG. 3, a multitude of observability points may be established along debug bus 350.

At each observability point 312, 314, various multiplexing structures may funnel data onto the debug bus 350. Some or all of the signals received via debug bus 350 may be considered as triggering events by DSM 320, which may invoke DSM 320 to produce a cross trigger on a cross trigger bus 360, as described in more detail elsewhere, herein.

Figure 4:
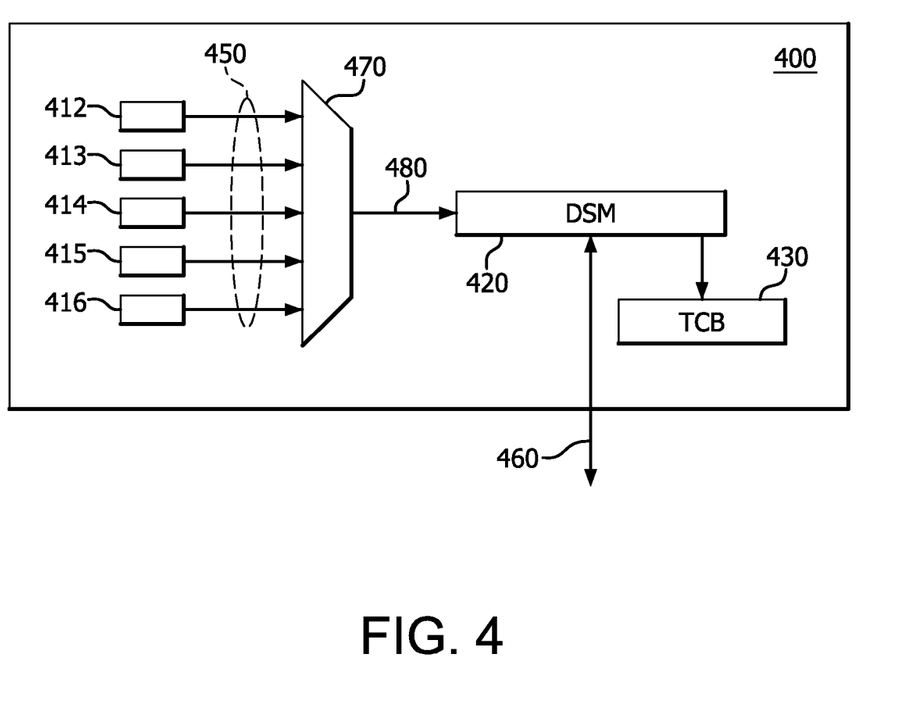
FIG. 4 is a block diagram of an electronic module with an integrated debug state machine, in accordance with another embodiment.

In the FIG. 3 embodiment, debug bus 350 is configured as a ring bus, although a debug bus may be differently configured, as well (e.g., a debug bus may have a parallel structure, such as depicted in FIG. 4, or similar star structure). In an embodiment, debug bus 350 is 64 bits wide, although debug bus 350 may be wider or narrower, in other embodiments. An advantage to the ring bus structure is that the structure may provide data from numerous observability points 312, 314 without the necessity for extensive parallel routing. However, the ring bus structure may have increased latency when compared with a parallel bus implementation, particularly for observability points (e.g., point 312) that occur earlier in the ring bus.

FIG. 4 is a block diagram of an electronic module 400 with an integrated DSM 420, in accordance with another embodiment. For example, electronic module 400 may be a Northbridge (e.g., Northbridge 254, FIG. 2), a Southbridge (e.g., Southbridge 264, FIG. 2), or a GPU (e.g., GPU 274, FIG. 2), although electronic module 400 may be a different type of electronic module, as well. In an embodiment, as mentioned previously, DSM 420 may be capable of storing trace data in trace data storage (e.g., TCB 430), which includes information collected and/or produced by DSM 420 during execution of various operations performed by the electronic module 400.

DSM 420 is integrated with various observability points 412, 413, 414, 415, 416 of electronic module 400 by way of debug bus 450 and multiplexer (MUX) 470. Although MUX 470 is shown as a single multiplexer, MUX 470 may be implemented as a hierarchical structure in other embodiments. In hierarchical debug bus structure, a number of observability points may be linked in series with respect to other observability points that the bus serves.

Debug bus 450 and MUX 470 function as a conduit through which signals produced at the various observability points 412-416 within electronic module 400 may be conveyed to DSM 420. The output lines 480 from MUX 470 may be fed directly into DSM 420, in an embodiment. Although only five observability points 412-416 are shown in FIG. 4, a multitude of observability points may be established on debug bus 450. At each observability point 412-416, various multiplexing structures may funnel data onto the debug bus 450.

In the embodiment illustrated in FIG. 4, debug bus 450 is configured as a parallel bus. In an embodiment, debug bus 450 may have any number of parallel inputs to MUX 470, although only five are shown in FIG. 4, and the output lines 480 may be 64 bits wide. Alternatively, the output lines 480 may be wider or narrower, in other embodiments. Some or all of the signals received via output lines 480 may be considered as triggering events by DSM 420, which may invoke DSM 420 to produce a cross trigger on a cross trigger bus 460, as described in more detail elsewhere, herein. An advantage to the parallel bus structure is that the structure may provide reduced latency, when compared with the ring bus structure of FIG. 3. However, the parallel bus structure may warrant more extensive parallel routing, particularly when it is desirable to connect the debug bus 450 to numerous observability points.

The actual circuitry of a DSM may have any of a number of configurations that are suitable to facilitate the performance of debug operations within a system. The observability points 312, 314, 412-416 may be provided with debug bus wrapper circuitry to perform various debug processes in response to triggers with respect to the particular section of hardware being observed and to pass resultant debug data through the respective debug bus 350, 450. In an embodiment, the debug bus wrapper circuitry is integrated with its respective section of observed hardware and shares the power and/or voltage domain of that section of hardware.

The power and/or voltage domains of the respective sections of hardware observed at the observability points 312, 314, 412-416 may differ from each other and from the power and/or voltage domains of the respective DSM 320, 420. One reason that the hardware sections may be configured with different power or voltage domains is to permit selected components to be switched off or powered at a lower level in order to conserve energy, which can translate into longer battery life for battery powered devices.

Where the debug bus is configured in a ring or otherwise such that more than one observability point is coupled in series on a portion of the debug bus, debug processing can be impaired for one of the hardware sections being observed if power and/or voltage is reduced or turned off with respect to another one of the hardware sections within the bus series.

For example, in modern system-on-chip designs, various hardware sections may reside in dynamically-controlled voltage domains. During a power off event, a supply rail to an individual voltage domain may be completely shut off, causing all digital state to be lost. Power interruptions to adjacent domains may impact the ability of observability points residing in always-on domains to be processed, as they share a common debug data path and tracing circuitry.

Figure 5:
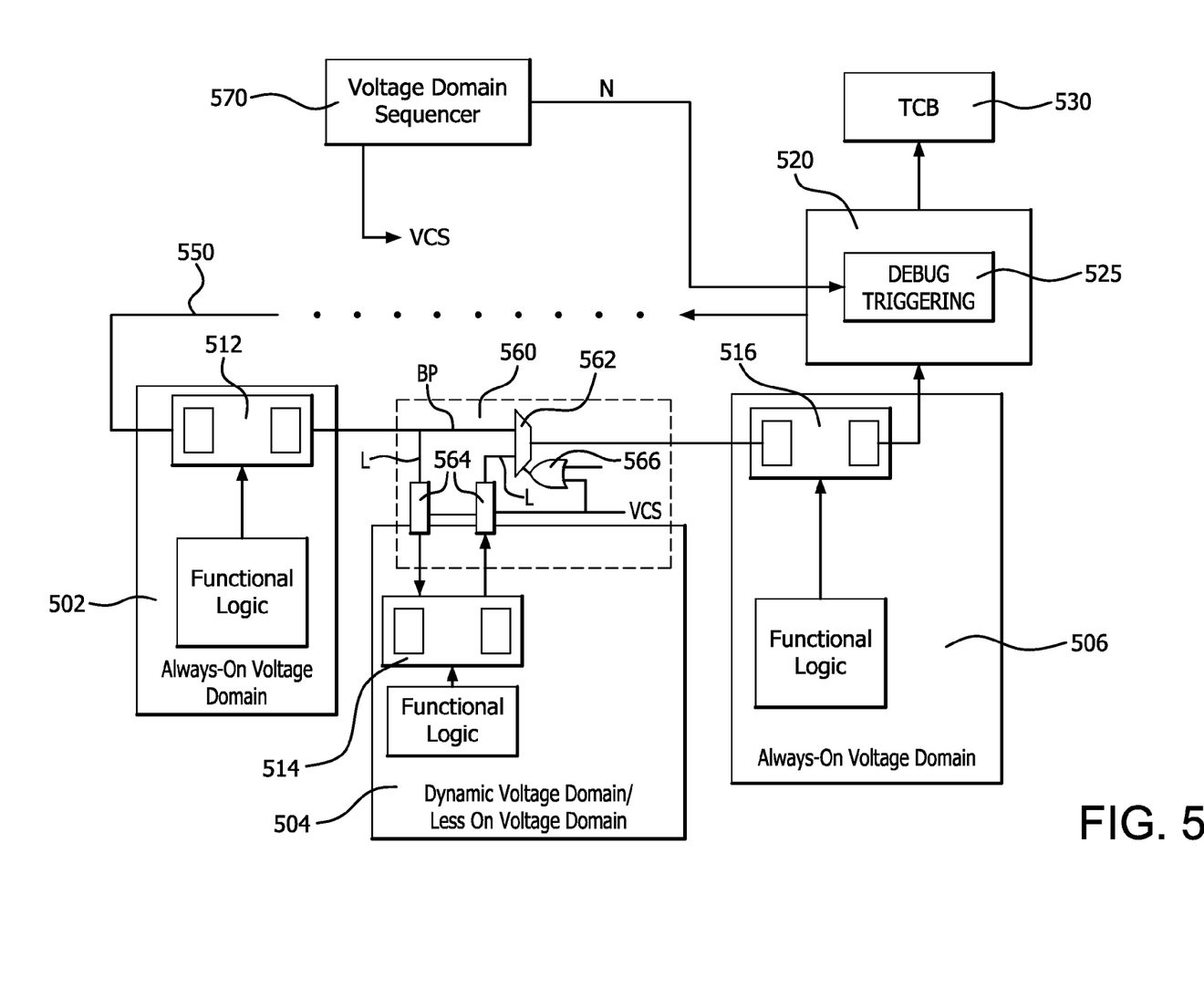
FIG. 5 is a block diagram of a debug circuit in accordance with an embodiment that includes a selectively switchable debug data bus component.

An example embodiment is provided in FIG. 5 that illustrates a sample implementation where a debug bus data path traverses both always-on voltage domains and a dynamically-powered voltage domain. In the FIG. 5 example, the debug circuitry includes a controlling component such as a DSM 520, a ring type debug bus 550 that communicates in series with a plurality of observability points associated with hardware sectors to provide test result data back to the DSM 520 that may be stored in a trace capture buffer (TCB) 530.

In the example of FIG. 5, three hardware sectors are depicted, 502, 504, 506 where one sectors 504 resides in a dynamically-controlled voltage domain and the other two sectors reside in "always on" voltage domains. Although the term "always on" is used in this example, the entire hardware component in which the debug circuitry resides may itself be selectively powered on and off. For example, the debug circuitry associated with core 220 of FIG. 2 may be powered as a whole in the same selective manner that the core 220 is powered with respect to the other cores and components of the SOC 200. As such, "always on" is used as a term relative to the dynamically-controlled voltage domain to indicate that the dynamically-controlled voltage domain may be turned off while the always on domains remain on. This can also happen with respect to different dynamically-controlled voltage domains, since one such domain may be controlled differently from another such domain.

The FIG. 5 example is non-limiting. There may be any combination of hardware sector domains served by the debug bus 550 including configurations where all of the hardware sectors reside in different dynamically-controlled voltage domains.

Referring to the FIG. 5 example, the hardware sectors 502, 506 that reside in the always on voltage domain are associated with debug bus wrapper circuits 512, 516, respectively, that are directly coupled with the debug bus 550. The hardware sector 504 that resides in the dynamically-controlled voltage domain is also associated with a similar debug bus wrapper circuit 514. However, a selectively switchable data bus component 560 is provided to couple the debug wrapper circuit 514 to the debug bus 550. The selectively switchable data bus component 560 is configured to couple via a data path loop L the debug wrapper circuit 514 associated with the hardware sector 504 that resides in the dynamically-controlled voltage domain when the power to that sector 504 is on and to switch to a bypass data path BP to bypass the debug wrapper circuit 514 when the power to that sector 504 is not on.

In the FIG. 5 example, the debug wrapper circuits 512, 514, 516 are illustrated as comprised of read and write flip flop stages that sample debug data and forward it at full function clock speed to the DSM 520 and/or the TCB 530. The selectively switchable data bus component 560 is illustrated as including a data path controlling multiplexor 562, voltage clamping circuitry 564 and switch control circuitry 566 configured to operate the data path controlling multiplexor 562 and voltage clamping circuitry 564.

A voltage domain sequencer 570 is provided that controls the dynamically-controlled voltage domains such as the domain in which hardware sector 504 resides. The voltage domain sequencer 570 is configured to provide a voltage control signal (VCS) to the switch control circuitry 566 indicating whether the dynamically-controlled voltage domain of hardware sector 504 is being turned off or on. When a VCS signal indicates the dynamically-controlled voltage domain of hardware sector 504 is being turned off, the switch control circuitry 566 controls the data path controlling multiplexor 562 to open the bypass data path BP and close the loop data path L of the selectively switchable data bus component 560 and to activate the clamping circuitry 564 to partition off the dynamically-controlled voltage domain from the debug bus 550. When a VCS signal indicates the dynamically-controlled voltage domain of hardware sector 504 is being turned on, the switch control circuitry 566 controls the data path controlling multiplexor 562 to close the bypass data path BP and open the loop data path L of the selectively switchable data bus component 560 and to activate the clamping circuitry 564 to couple the dynamically-controlled voltage domain to the debug bus 550 so that debug wrapper 514 can still transmit debug data and/or receive configuration instructions and data.

The above embodiment maintains coherence of the debug bus data during power-off events, because, in operation, the control circuitry 566 uses the VCS to control in tandem the voltage clamping circuitry 564 and the multiplexor 562 controlling the debug bus data path. The multiplexor 562 temporarily excludes the debug bus path through the dynamically-controlled voltage domain, yet still forwards the debug observability data gathered by the debug wrapper 512 and associated with hardware sector 502.

The switch control circuitry can be configured to operate the data path controlling multiplexor and voltage clamping circuitry to bypass the debug wrapper circuit 512 associated with the voltage controlled sector 502 upon selected conditions irrespective of the state of the dynamically-controlled voltage domain. For example, there can also be an optional programmable register to statically configure the multiplexor 562 to always exclude the debug bus path through the dynamically-controlled voltage domain of hardware sector 504.

Figure 6:
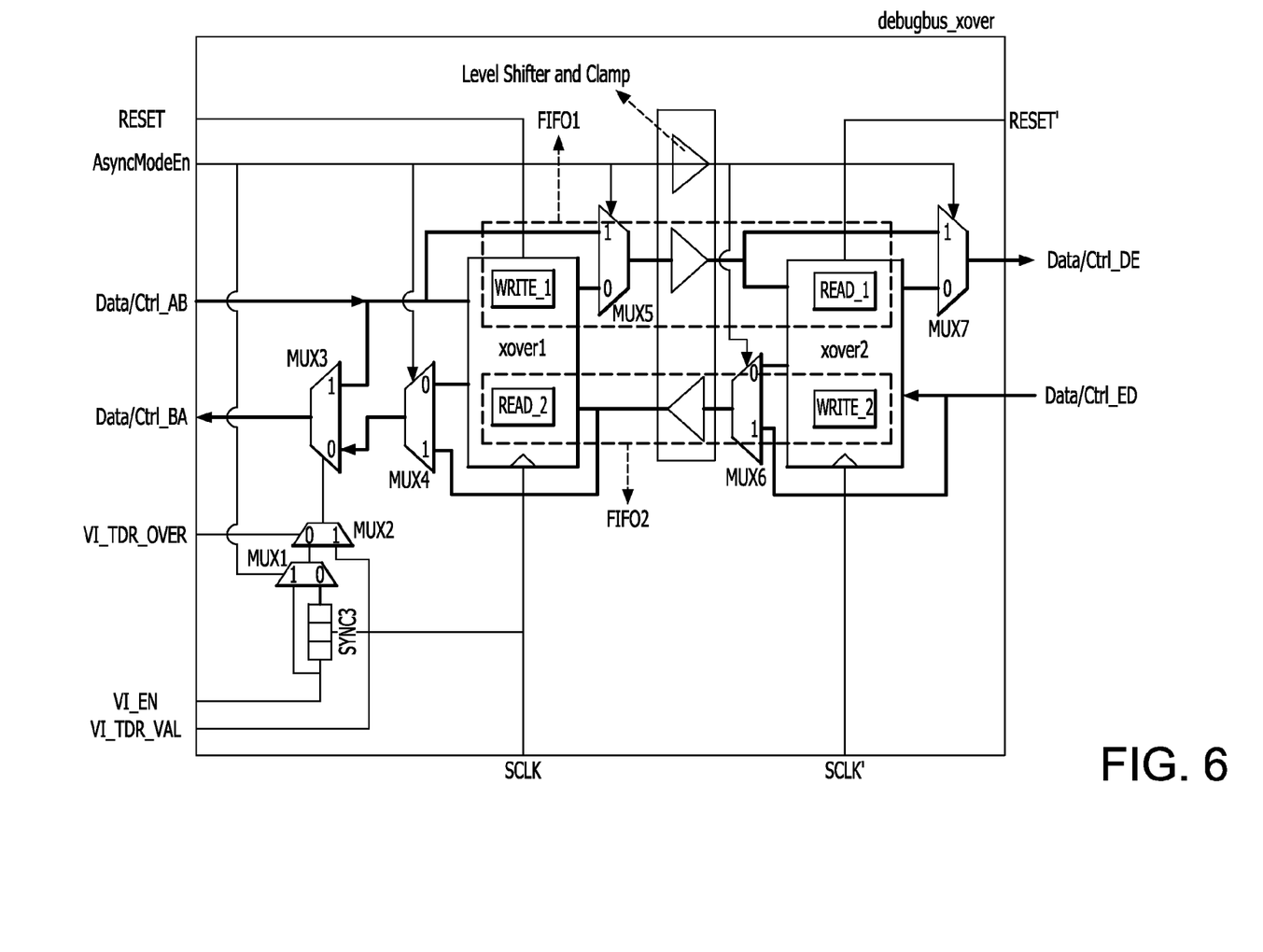
FIG. 6 is a schematic diagram of an example of circuitry for the selectively switchable debug data bus component of FIG. 5 and related circuitry.

Referring to FIG. 6, a more detailed example of the selectively switchable data bus component 560 and that debug wrapper circuitry 514 is provided. In the example of FIG. 6, the debug wrapper circuitry 514 residing in the dynamically-controlled voltage domain uses two instances of cross over (xover) which is a synchronous FIFO with a fixed difference/offset between the read and write pointers for deterministic crossing of debug data and control paths (Data/Ctrl). The FIFO instances are shown as FIFO1 and FIFO2 in FIG. 6.

The FIFO is split across xover1 and xover2. The FIFO, accordingly, straddles the voltage domain crossing since xover1 and xover2 reside in different voltage domains. The write portion of the FIFO1 is located inside xover1 and the corresponding read logic is located inside xover2. Similarly, the write portion of the FIFO2 is located inside xover2 and the corresponding read logic is located inside xover1. The delay between the pointers is determined by the skew between functional clocks SCLK and SCLK' and signal combinational path delay between the FIFO instances.

In this example, both the clocks originate from the same source but are not skew balanced across voltage domains. SCLK is used as the clock for the always on domain and SCLK' is a level shifted version of the SCLK and used as the clock for the less on domain. RESET' and RESET also from the same source. RESET' is the level shifted version of the RESET and is used as the synchronous reset for the less on domain. RESET is used as the synchronous reset for the always on domain. The voltage domain sequencer asserts/de-asserts RESET/RESET' only when the SCLK/SCLK' is gated OFF. This ensures that the FIFO pointers always start with a fixed difference/offset and guarantees synchronous and deterministic signal crossing across voltage domains.

The VCS signal from the voltage domain sequencer 570 may be implemented via lines VI_TDR_OVER, VI_EN, and VI_TDR_VAL. When VI_TDR_OVER is programmed statically to 0, VI_EN controls the multiplexor MUX3. Asserting VI_EN to 1 configures the debugbus_xover to connect always-on input Data/Ctrl_AB to the always-on output Data/Ctrl_BA. This ensures that the continuity of the debug bus is maintained for the always on debug wrappers. The debug bus chain excludes the debug wrappers in the less on domain. Externally, the VI_TDR_OVER and VI_TDR_VAL may be connected to programmable data registers. VI_EN is connected to the voltage domain sequencer's VCS. This corresponds to the bypass path BP being open as discussed above with respect to FIG. 5.

When VI_EN is set to 0, the debug bus includes all the debug wrappers in both the power domains. It configures the debugbus_xover such that the always-on input Data/Ctrl_AB is propagated to the less on output Data/Ctrl_DE through the xover fifo1. Similarly, the less on input Data/Ctrl_ED is propagated to the always on output Data/Ctrl_BA through the xover fifo2. The VI_EN provides a mechanism to dynamically configure the debug bus daisy chain to an all always-on chain or include debug wrappers in all domains. This corresponds to the bypass path BP being closed and the loop path L of the selectively switchable component being used as discussed above with respect to FIG. 5.

This mode is useful for scenarios multiple debug wrappers across power domains are being observed. When VI_EN asserts to 1, the debug wrapper from the always on domain still has a path to the debug trace setup.

This example also supports a mode where only hardware sectors in the always-on domain need to be debugged and observation from the less-on domains is not needed. When VI_TDR_OVER and VI_TDR_VAL are programmed to 1, the multiplexor MUX3 statically configures the debugbus_xover to output Data/Ctrl_AB onto Data/Ctrl_BA which configures the debug bus to exclude the path through the less on voltage domain.

This example supports both synchronous as well as asynchronous forms of debug bus structures. Programming AsyncModeEn to 1 selects the leg1 paths through multiplexors MUX1, MUX4, MUX5, MUX6 and MUX7 and configures it to operate in the asynchronous mode.

Additionally, this example provides for a notification mechanism, such as a Power Transition Notification N in FIG. 5 that may be coupled with a triggering component 525 of the DSM 520. Such a notification can be useful, particularly if the debug data, from dynamically controlled hardware sector 504, displays unwanted or incorrect data during power-down or power-up transitions. Since the power sequencer 570 has advance notice of upcoming power events, the sequencer 570 is in a unique position to provide both controls and notifications described in above which can used by the debug trace/trigger setup to prevent a trace from being corrupted or the triggering of any false actions.

The VCS signaling described herein is exemplary, and should not be limiting. The VCS block may be a hardware state-machine, or alternately may be formed by microcontroller firmware. Either implementation/embodiment (a hardware signal from multiplexor 562 or firmware writing to a register local/near to multiplexor 562) may provide the VCS control.

For the sake of brevity, conventional techniques related to integrated circuit design, caching, memory operations, memory controllers, and other functional aspects of the systems (and the individual operating components of the systems) have not been described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used in the following description for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although the figures may depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It will also be appreciated that the exemplary embodiment or embodiments described herein are not intended to limit the scope, applicability, or configuration of the claimed subject matter in any way. Rather, the foregoing detailed description will provide those skilled in the art with a convenient and edifying road map for implementing the described embodiment or embodiments. It will be understood that various changes can be made in the function and arrangement of elements without departing from the scope defined by the claims, which includes known equivalents and foreseeable equivalents at the time of filing this patent application.

The invention claimed is:

1. An integrated circuit (IC) comprising:
a plurality of hardware sectors, each hardware sector associated with a debug observability circuit that is served by a debug data bus of a debug circuit, wherein the plurality of hardware sectors includes one or more steady state sectors residing in an always on power domain that remains on whenever the debug circuit is operable, and the debug observability circuits associated with the steady state sectors are directly coupled to the debug data bus;
the plurality of hardware sectors including a controlled sector, the controlled sector residing in a dynamically-controlled power domain that may be turned off while the power domain of another sector remains on; and
a selectively switchable data bus component configured to couple the debug observability circuit associated with the controlled sector to the debug data bus when the power to the controlled sector is on and to switch to bypass the debug observability circuit associated with the controlled sector when the power to the controlled sector is not on.

2. The IC according to claim 1 wherein:
the plurality of hardware sectors include a plurality of controlled sectors residing in dynamically-controlled power domains that may be turned off while the power domain of another sector remains on; and
for each controlled sector, a selectively switchable data bus component configured to couple the debug observability circuit associated with the controlled sector to the debug data bus when the power to the controlled sector is on and to switch to bypass the debug observability circuit associated with the controlled sector when the power to the controlled sector is not on.

3. The IC according to claim 2 wherein:
the debug observability circuits associated with the one or more steady state sectors are directly coupled to the debug data bus in series with at least one of the selectively switchable data bus components.

4. The IC according to claim 1 wherein the debug observability circuits are configured as debug wrapper circuits comprised of read and write flip flop stages.

5. The IC according to claim 1 where the dynamically-controlled power domain is a dynamically-controlled voltage domain wherein the selectively switchable data bus component includes:
   a data path controlling multiplexor configured to control the data flow on the debug data bus to be coupled with or to bypass the debug observability circuit associated with the controlled sector;
   voltage clamping circuitry configured to selectively partition the controlled sector from the debug data bus or couple the debug data bus to the debug observability circuit associated with the controlled sector; and
   switch control circuitry configured to operate the data path controlling multiplexor and voltage clamping circuitry.

6. The IC according to claim 5 further comprising:
   a voltage domain sequencer configured to control the dynamically-controlled voltage domain of the controlled sector;
   the voltage domain sequencer configured to provide a voltage control signal (VCS) to the switch control circuitry indicating whether the dynamically-controlled voltage domain of controlled sector is being turned off or on;
   whereby:
   upon a condition that a VCS signal indicates the dynamically-controlled voltage domain of the controlled sector is being turned off, the switch control circuitry controls the data path controlling multiplexor to bypass the debug observability circuit associated with the controlled sector and to activate the clamping circuitry to partition off the dynamically-controlled voltage domain from the debug data bus; and
   upon a condition that a VCS signal indicates the dynamically-controlled voltage domain of the controlled sector is being turned on, the switch control circuitry controls the data path controlling multiplexor and the clamping circuitry to couple the debug observability circuit associated with the controlled sector to the debug bus.

7. The IC according to claim 5 wherein the switch control circuitry is configured to operate the data path controlling multiplexor and voltage clamping circuitry to bypass the debug observability circuit associated with the controlled sector upon selected conditions irrespective of the state of the dynamically-controlled voltage domain.

8. The IC according to claim 1 wherein the plurality of hardware sectors are associated with the debug data bus in a ring configuration.

9. A debug method for integrated circuit (IC) comprising:
   providing a plurality of hardware sectors, each hardware sector associated with a debug observability circuit that is served by a debug data bus of a debug circuit where the plurality of hardware sectors includes a controlled sector, the controlled sector residing in a dynamically-controlled power domain that may be turned off while the power domain of another sector remains on, wherein the plurality of hardware sectors includes one or more steady state sectors residing in an always on power domain that remains on whenever the debug circuit is operable, and the debug observability circuits associated with the steady state sectors are directly coupled to the debug data bus; and
   selectively switching the debug observability circuit associated with the controlled sector to be coupled to the debug data bus when the power to the controlled sector is on and to be bypassed by the debug data bus when the power to the controlled sector is not on.

10. The method according to claim 9 where the plurality of hardware sectors include a plurality of controlled sectors residing in dynamically-controlled power domains that may be turned off while the power domain of another sector remains on, further comprising:
    for each controlled sector, selectively switching the debug observability circuit associated with the controlled sector to be coupled to the debug data bus when the power to the controlled sector is on and to be bypassed by the debug data bus when the power to the controlled sector is not on.

11. The method according to claim 9 where the dynamically-controlled power domain is a dynamically-controlled voltage domain wherein the selectively switching is performed by:
    a data path controlling multiplexor configured to control the data flow on the debug data bus to be coupled with or to bypass the debug observability circuit associated with the controlled sector;
    voltage clamping circuitry configured to selectively partition the controlled sector from the debug data bus or couple the debug data bus to the debug observability circuit associated with the controlled sector; and
    switch control circuitry configured to operate the data path controlling multiplexor and voltage clamping circuitry.

12. The method of claim 11 further comprising:
    using a voltage domain sequencer configured to control the dynamically-controlled voltage domain of the controlled sector; and
    providing a voltage control signal (VCS) to the switch control circuitry indicating whether the dynamically-controlled voltage domain of controlled sector is being turned off or on;
    whereby:
    upon a condition that a VCS signal indicates the dynamically-controlled voltage domain of the controlled sector is being turned off, the switch control circuitry controls the data path controlling multiplexor to bypass the debug observability circuit associated with the controlled sector and to activate the clamping circuitry to partition off the dynamically-controlled voltage domain from the debug data bus; and
    upon a condition that a VCS signal indicates the dynamically-controlled voltage domain of the controlled sector is being turned on, the switch control circuitry controls the data path controlling multiplexor and the clamping circuitry to couple the debug observability circuit associated with the controlled sector to the debug bus.

13. A non-transitory computer-readable storage medium storing a set of instructions for execution by a general purpose computer to facilitate manufacture of an integrated circuit that includes:
    a plurality of hardware sectors, each hardware sector associated with a debug observability circuit that is served by a debug data bus of a debug circuit, wherein the plurality of hardware sectors includes one or more steady state sectors residing in an always on power domain that remains on whenever the debug circuit is operable, and the debug observability circuits associated with the steady state sectors are directly coupled to the debug data bus;
    the plurality of hardware sectors including a controlled sector, the controlled sector residing in a dynamically-controlled power domain that may be turned off while the power domain of another sector remains on; and a selectively switchable data bus component configured to couple the debug observability circuit associated with the controlled sector to the debug data bus when the power to the controlled sector is on and to switch to bypass the debug observability circuit associated with the controlled sector when the power to the controlled sector is not on.

14. The non-transitory computer-readable storage medium of claim 13, where the dynamically-controlled power domain is a dynamically-controlled voltage domain wherein the selectively switchable data bus component includes:

a data path controlling multiplexor configured to control the data flow on the debug data bus to be coupled with or to bypass the debug observability circuit associated with the controlled sector;

voltage clamping circuitry configured to selectively partition the controlled sector from the debug data bus or couple the debug data bus to the debug observability circuit associated with the controlled sector; and switch control circuitry configured to operate the data path controlling multiplexor and voltage clamping circuitry.

15. The non-transitory computer-readable storage medium of claim 14, wherein the integrated circuit further comprising:

a voltage domain sequencer configured to control the dynamically-controlled voltage domain of the controlled sector;

the voltage domain sequencer configured to provide a voltage control signal (VCS) to the switch control circuitry indicating whether the dynamically-controlled voltage domain of controlled sector is being turned off or on;

whereby:

upon a condition that a VCS signal indicates the dynamically-controlled voltage domain of the controlled sector is being turned off, the switch control circuitry controls the data path controlling multiplexor to bypass the debug observability circuit associated with the controlled sector and to activate the clamping circuitry to partition off the dynamically-controlled voltage domain from the debug data bus; and upon a condition that a VCS signal indicates the dynamically-controlled voltage domain of the controlled sector is being turned on, the switch control circuitry controls the data path controlling multiplexor and the clamping circuitry to couple the debug observability circuit associated with the controlled sector to the debug bus.

16. The non-transitory computer-readable storage medium of claim 14, wherein the switch control circuitry is configured to operate the data path controlling multiplexor and voltage clamping circuitry to bypass the debug observability circuit associated with the controlled sector upon selected conditions irrespective of the state of the dynamically-controlled voltage domain.

17. The non-transitory computer-readable storage medium of claim 13, wherein the plurality of hardware sectors are associated with the debug data bus in a ring configuration.

18. The non-transitory computer-readable storage medium of claim 13, wherein the instructions are hardware description language (HDL) instructions used for the manufacture of a device.

* * * * *